United States Patent [19]

Park et al.

[11] Patent Number: 5,702,569

[45] Date of Patent: Dec. 30, 1997

[54] METHOD FOR MANUFACTURING A THIN FILM ACTUATED MIRROR HAVING A STABLE ELASTIC MEMBER

[75] Inventors: Myung-Hyun Park; Myung-Kwon Koo; Min-Sik Um, all of Seoul, Rep. of Korea

[73] Assignee: Daewoo Electronics, Co., Ltd., Seoul, Rep. of Korea

[21] Appl. No.: 703,257

[22] Filed: Aug. 26, 1996

[30] Foreign Application Priority Data

Aug. 30, 1995 [KR] Rep. of Korea ............. 95-27516
Aug. 30, 1995 [KR] Rep. of Korea ............. 95-27517
Nov. 30, 1995 [KR] Rep. of Korea ............. 95-46576

[51] Int. Cl.$^6$ ............. C03C 15/00; B05D 5/06
[52] U.S. Cl. ............. 156/662.1; 427/126.2; 427/126.3; 427/164; 427/248.1; 427/255.2; 427/270; 427/419.2; 427/419.7; 427/294
[58] Field of Search ............. 427/164, 126.2, 427/126.3, 270, 294, 248.1, 255.2, 419.3, 419.7; 156/662.1

[56] References Cited

U.S. PATENT DOCUMENTS 5,552,923  9/1996  Min ............................. 359/224
5,579,179  11/1996  Buom et al. .................. 359/846

FOREIGN PATENT DOCUMENTS 0 652 455  5/1995  European Pat. Off. .

*Primary Examiner*—Janyce Bell
*Attorney, Agent, or Firm*—Pennie & Edmonds, LLP

[57] ABSTRACT

A method for forming an elastic member in a thin film actuated mirror, the method being capable of controlling a stress built up therein, is disclosed. The method includes the steps of: forming a thin film sacrificial layer; depositing an elastic layer on top of the thin film sacrificial layer by using a CVD method; forming an actuating structure on top of the elastic layer, the actuating structure having a first thin film electrode, a thin film electrodisplacive member, a second thin film electrode and an elastic member; and removing the thin film sacrificial layer. In the present invention, the elastic layer is vertically divided into at least two portions, each of the portions being made of a same material having a different stoichiometry. The stress built up in the elastic layer is controlled by controlling the ratio of the source gases.

8 Claims, 8 Drawing Sheets

METHOD FOR MANUFACTURING A THIN FILM ACTUATED MIRROR HAVING A STABLE ELASTIC MEMBER

FIELD OF THE INVENTION

The present invention relates to an array of M×N thin film actuated mirrors for use in an optical projection system; and, more particularly, to a method for controlling a stress built up in an elastic member during the manufacture of the thin film actuated mirror.

BACKGROUND OF THE INVENTION

Among the various video display systems available in the art, an optical projection system is known to be capable of providing high quality displays in a large scale. In such an optical projection system, light from a lamp is uniformly illuminated onto an array of, e.g., M×N, actuated mirrors, wherein each of the mirrors is coupled with each of the actuators. The actuators may be made of an electrodisplacive material such as a piezoelectric or an electrostrictive material which deforms in response to an electric field applied thereto.

The reflected light beam from each of the mirrors is incident upon an aperture of, e.g., an optical baffle. By applying an electrical signal to each of the actuators, the relative position of each of the mirrors to the incident light beam is altered, thereby causing a deviation in the optical path of the reflected beam from each of the mirrors. As the optical path of each of the reflected beams is varied, the amount of light reflected from each of the mirrors which passes through the aperture is changed, thereby modulating the intensity of the beam. The modulated beams through the aperture are transmitted onto a projection screen via an appropriate optical device such as a projection lens, to thereby display an image thereon.

In FIGS. 1A to 1G, there are illustrated manufacturing steps involved in manufacturing an array 100 of M×N thin film actuated mirrors 101, wherein M and N are integers, disclosed in a copending commonly owned application, U.S. Ser. No. 08/430,628, entitled "THIN FILM ACTUATED MIRROR ARRAY".

The process for manufacturing the array 100 begins with the preparation of an active matrix 10 having a top surface and comprising a substrate 12, an array of M×N transistors (not shown) and an array of M×N connecting terminals 14.

In a subsequent step, there is formed on the top surface of the active matrix 10 a thin film sacrificial layer 24 by using a sputtering or an evaporation method if the thin film sacrificial layer 24 is made of a metal, a chemical vapor deposition (CVD) or a spin coating method if the thin film sacrificial layer 24 is made of a phosphor-silicate glass (PSG), or a CVD method if the thin film sacrificial layer 24 is made of a poly-Si.

Thereafter, there is formed a supporting layer 20 including an array of M×N supporting members 22 surrounded by the thin film sacrificial layer 24, wherein the supporting layer 20 is formed by: creating an array of M×N empty slots (not shown) on the thin film sacrificial layer 24 by using a photolithography method, each of the empty slots being located around the connecting terminals 14; and forming a supporting member 22 in each of the empty slots located around the connecting terminals 14 by using a sputtering or a CVD method, as shown in FIG. 1A. The supporting members 22 are made of an insulating material, e.g., stoichiometric silicon nitride ($Si_3N_4$).

In a following step, an elastic layer 30 made of the same insulating material, e.g., $Si_3N_4$, as the supporting members 22 is formed on top of the supporting layer 20 by using a Sol-Gel, a sputtering or a CVD method.

Subsequently, a conduit 26 made of a metal is formed in each of the supporting members 22 by: first creating an array of M×N holes (not shown), each of the holes extending from top of the elastic layer 30 to top of the connecting terminals 14, by using an etching method; and filling therein with the metal to thereby form the conduit 26, as shown in FIG. 1B.

In a next step, a second thin film layer 40 made of an electrically conducting material is formed on top of the elastic layer 30 including the conduits 26 by using a sputtering method. The second thin film layer 40 is electrically connected to the transistors through the conduits 26 formed in the supporting members 22.

Then, a thin film electrodisplacive layer 50 made of a piezoelectric material, e.g., lead zirconium titanate (PZT), is formed on top of the second thin film layer 40 by using a sputtering method, a CVD method or a Sol-Gel method, as shown in FIG. 1C.

In an ensuing step, the thin film electrodisplacive layer 50, the second thin film layer 40 and the elastic layer 30 are patterned into an array of M×N thin film electrodisplacive members 55, an array of M×N second thin film electrodes 45 and an array of M×N elastic members 35 by using a photolithography or a laser trimming method until the supporting layer 20 is exposed, as shown in FIG. 1D. Each of the second thin film electrodes 45 is electrically connected to the transistor through the conduit 26 formed in each of the supporting members 22 and functions as a signal electrode in the thin film actuated mirrors 101.

Next, each of the thin film electrodisplacive members 55 is heat treated to allow a phase transition to take place to thereby form an array of M×N heat treated structures (not shown). Since each of the heat treated thin film electrodisplacive members 55 is sufficiently thin, there is no need to pole it in case it is made of a piezoelectric material: for it can be poled with the electric signal applied during the operation of the thin film actuated mirrors 101.

After the above step, an array of M×N first thin film electrodes 65 made of an electrically conducting and light reflecting material is formed on top of the thin film electrodisplacive members 55 in the array of M×N heat treated structures by first forming a layer 60, made of the electrically conducting and light reflecting material, completely covering top of the array of M×N heat treated structures, including the exposed supporting layer 20, using a sputtering method, as shown in FIG. 1E, and then selectively removing the layer 60, using an etching method, resulting in an array 110 of M×N actuated mirror structures 111, wherein each of the actuated mirror structures 111 includes a top surface and four side surfaces, as shown in FIG. 1F. Each of the first thin film electrodes 65 functions as a mirror as well as a bias electrode in the thin film actuated mirrors 101.

The preceeding step is then followed by completely covering the top surface and the four side surfaces in each of the actuated mirror structures 111 with a thin film protection layer (not shown).

The thin film sacrificial layer 24 in the supporting layer 20 is then removed by using an wet etching method. Finally, the thin film protection layer is removed to thereby form the array 100 of M×N thin film actuated mirrors 101, as shown in FIG. 1G.

There are certain deficiencies associated with the above described method for manufacturing the array 100 of M×N thin film actuated mirrors 101. For example, in case when the elastic member 35 is made of $Si_3N_4$ which is formed usually by stoichiometrically reacting $NH_3$ and $SiH_2Cl_2$ gases, as the thickness of the elastic member 35 increases, especially, 2000 Å and over, a density thereof and a stress built therein also increase, which, in turn, may cause cracks to be formed therein. Furthermore, a combination of the stresses built up in the elastic member 35 thus formed and the thin film electrode and electrodisplacive layers formed on top thereof may force each of the thin film actuated mirrors 101 thus prepared to warp upward, affecting the performance of the respective thin film actuated mirror 101. When enough of the thin film actuated mirrors 101 are thus affected, the overall performance of the array 100 may also degrade.

SUMMARY OF THE INVENTION

It is, therefore, a primary object of the present invention to provide a method for the manufacture of an array of M×N thin film actuated mirrors for use in an optical projection system, the method being capable of controlling a build up of the stress in an elastic member in each of the thin film actuated mirrors.

In accordance with one aspect of the present invention, there is provided a method for the manufacture of an array of M×N thin film actuated mirrors, wherein M and N are integers, for use in an optical projection system, the method comprising the steps of: forming a thin film sacrificial layer on top of an active matrix; depositing an elastic layer on top of the thin film sacrificial layer, wherein the elastic layer is vertically divided into at least two portions, each of the portions being made of a same material having a different stoichiometry; forming an array of M×N actuating structures on top of the elastic layer, each of the actuating structures including a first thin film electrode, a thin film electrodisplacive member, a second thin film electrode and an elastic member; and removing the thin film sacrificial layer, thereby forming the array of M×N thin film actuated mirrors.

BRIEF DESCRIPTION OF THE DRAWINGS

The above and other objects and features of the present invention will become apparent from the following description of the preferred embodiments, when given in conjunction with the accompanying drawings, wherein.

DETAILED DESCRIPTION OF THE PREFERRED EMBODIMENTS

Figure 1A:
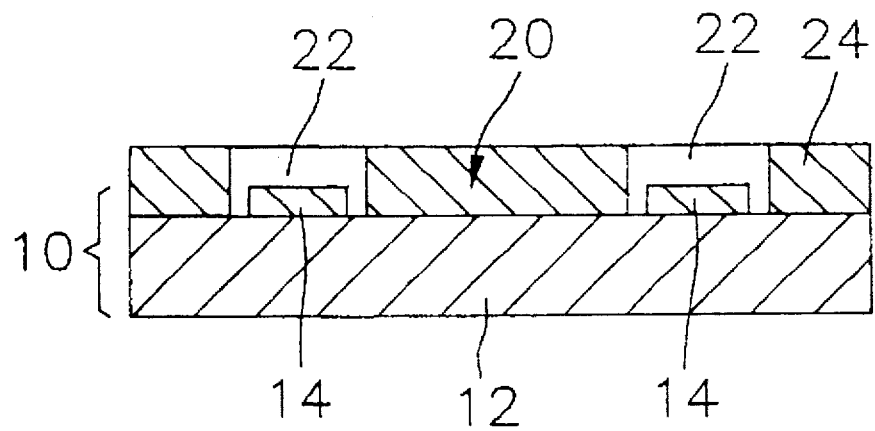
FIGS. 1A to 1G are schematic cross sectional views illustrating a method for the manufacture of an array of M×N thin film actuated mirrors previously disclosed.
Figure 1B:
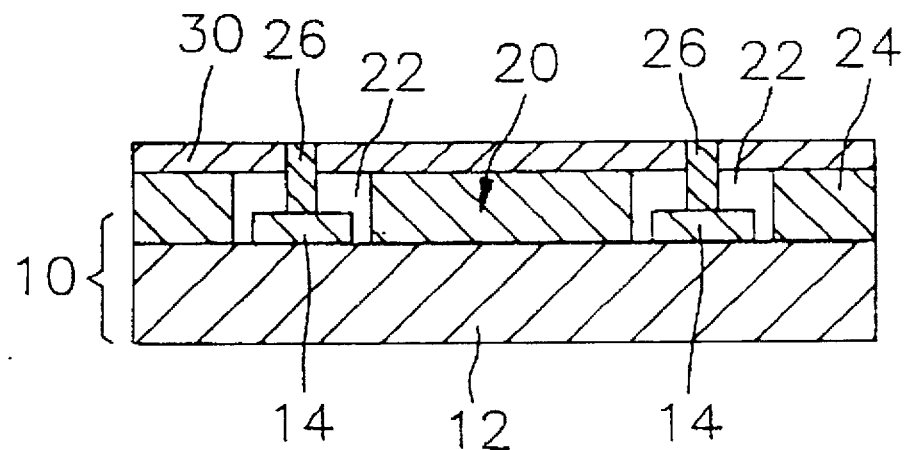
Figure 1C:
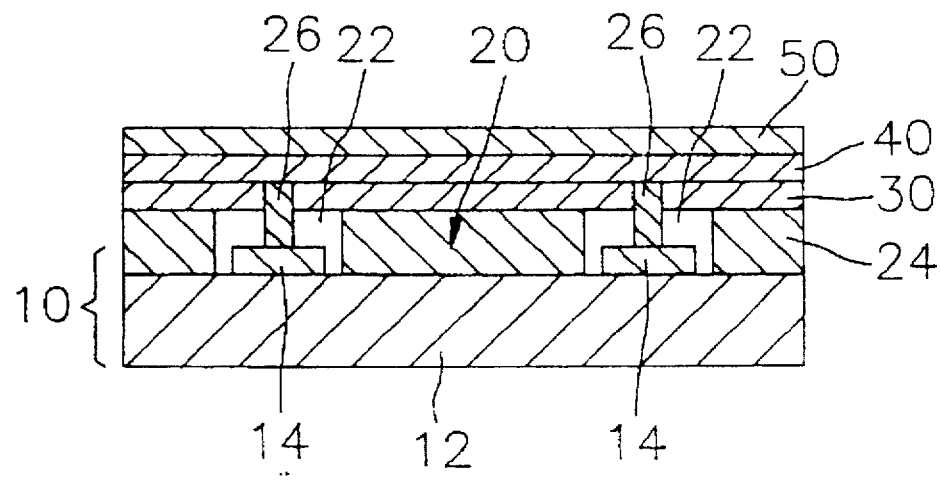
Figure 1D:
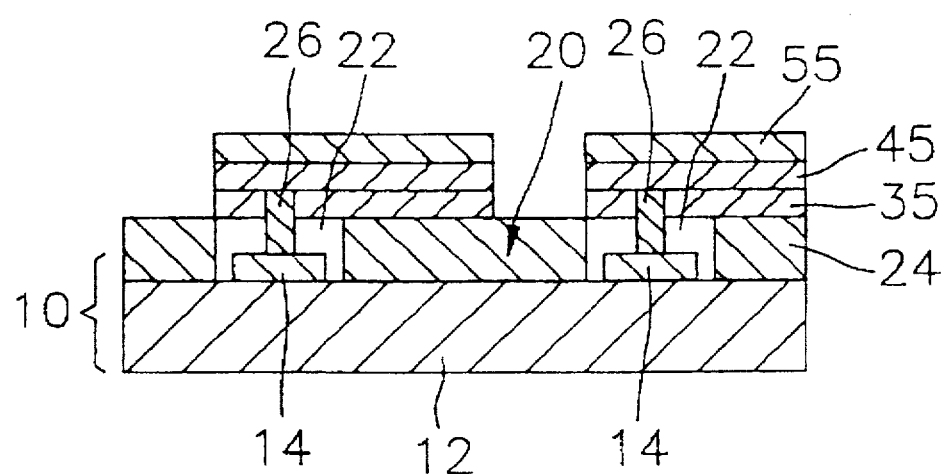
Figure 1E:
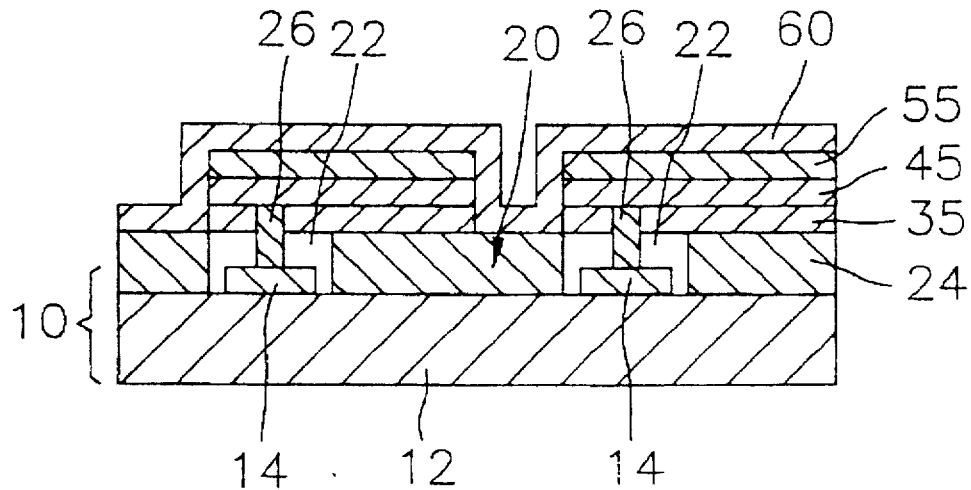
Figure 1F:
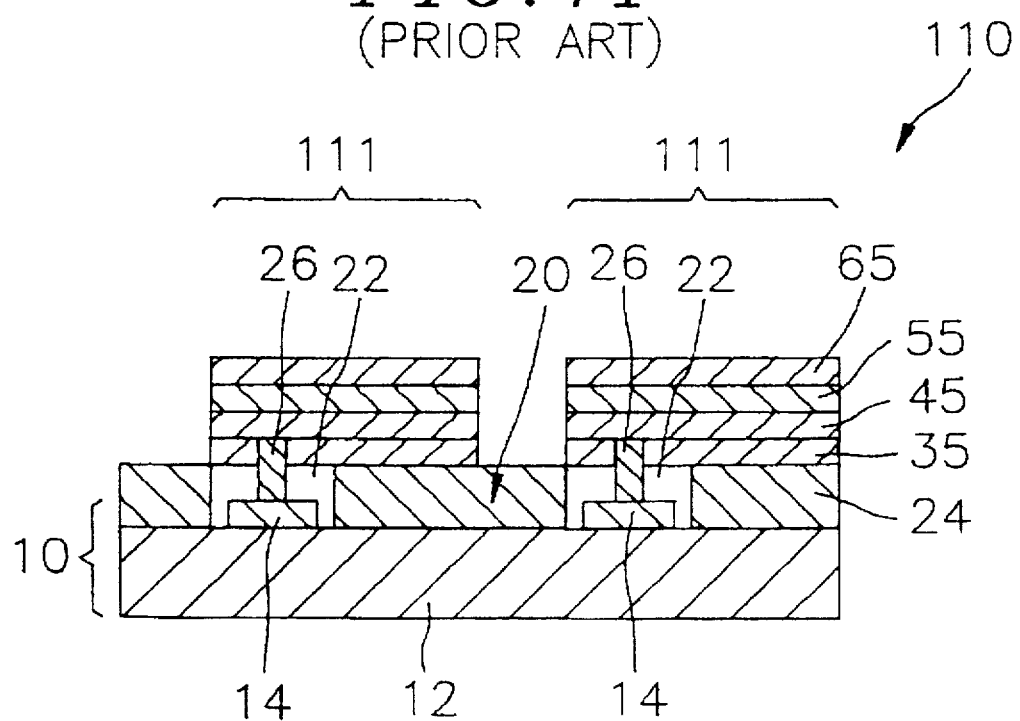
Figure 1G:
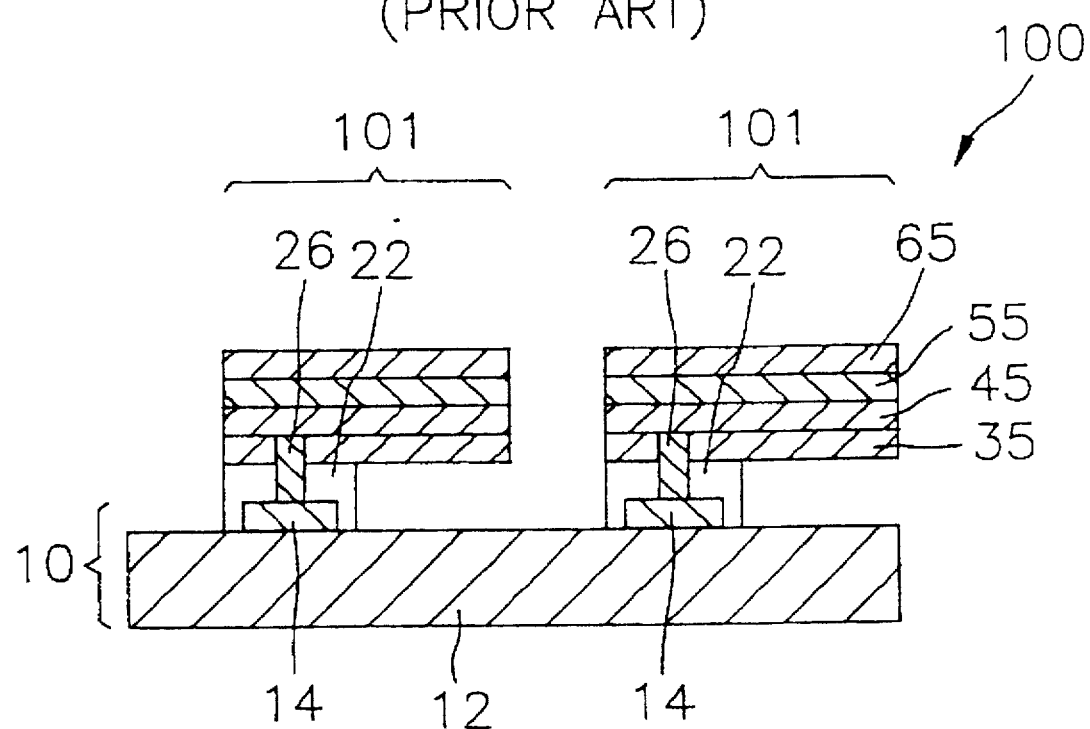

There are provided in FIGS. 2A to 2F schematic cross sectional views setting forth a method for the manufacture of an array 300 of M×N thin film actuated mirrors 301, wherein M and N are integers, for use in an optical projection system, in accordance with the present invention. It should be noted that like parts appearing in FIGS. 2A to 2F are represented by like reference numerals.

The process for the manufacture of the array 300 begins with the preparation of an active matrix 210 including a substrate 212 with an array of M×N connecting terminals 214 formed on top of the substrate 212 and an array of M×N transistors (not shown), wherein each of the connecting terminals 214 is electrically connected to a corresponding transistor in the array of transistors.

In a subsequent step, there is formed on top of the active matrix 210 a thin film sacrificial layer 224, having a thickness of 0.1–2 μm, and made of a metal, e.g., copper (Cu) or nickel (Ni), a phosphor-silicate glass (PSG) or a poly-Si. The thin film sacrificial layer 224 is formed by using a sputtering or an evaporation method if the thin film sacrificial layer 224 is made of a metal, a chemical vapor deposition (CVD) method or a spin coating method if the thin film sacrificial layer 224 is made of a PSG, or a CVD method if the thin film sacrificial layer 224 is made of a poly-Si.

Thereafter, there is formed an array of M×N empty cavities (not shown) on the thin film sacrificial layer 224 by using an etching method. Each of the empty cavities is located around top of the connecting terminal 214.

Subsequently, an elastic layer 230, made of a nonstoichiometric silicon nitride, and having a thickness of 0.1–2 μm, is deposited on top of the thin film sacrificial layer 224 including the empty cavities by using a lower pressure chemical vapor deposition (LPCVD) method, wherein source gases, i.e., $SiH_2Cl_2$ and $NH_3$, are usually reacted at 700° to 900° C. and under a pressure of 350 to 1000 mtorr, and the ratio of $SiH_2Cl_2$ to $NH_3$ is increased during the deposition of the elastic layer 230.

When the reaction temperature exceeds 900° C., the active matrix 210 and the thin film sacrificial layer 224 formed on top thereof may get thermally damaged and, at below 700° C., the source gases may not properly react.

Figure 3:
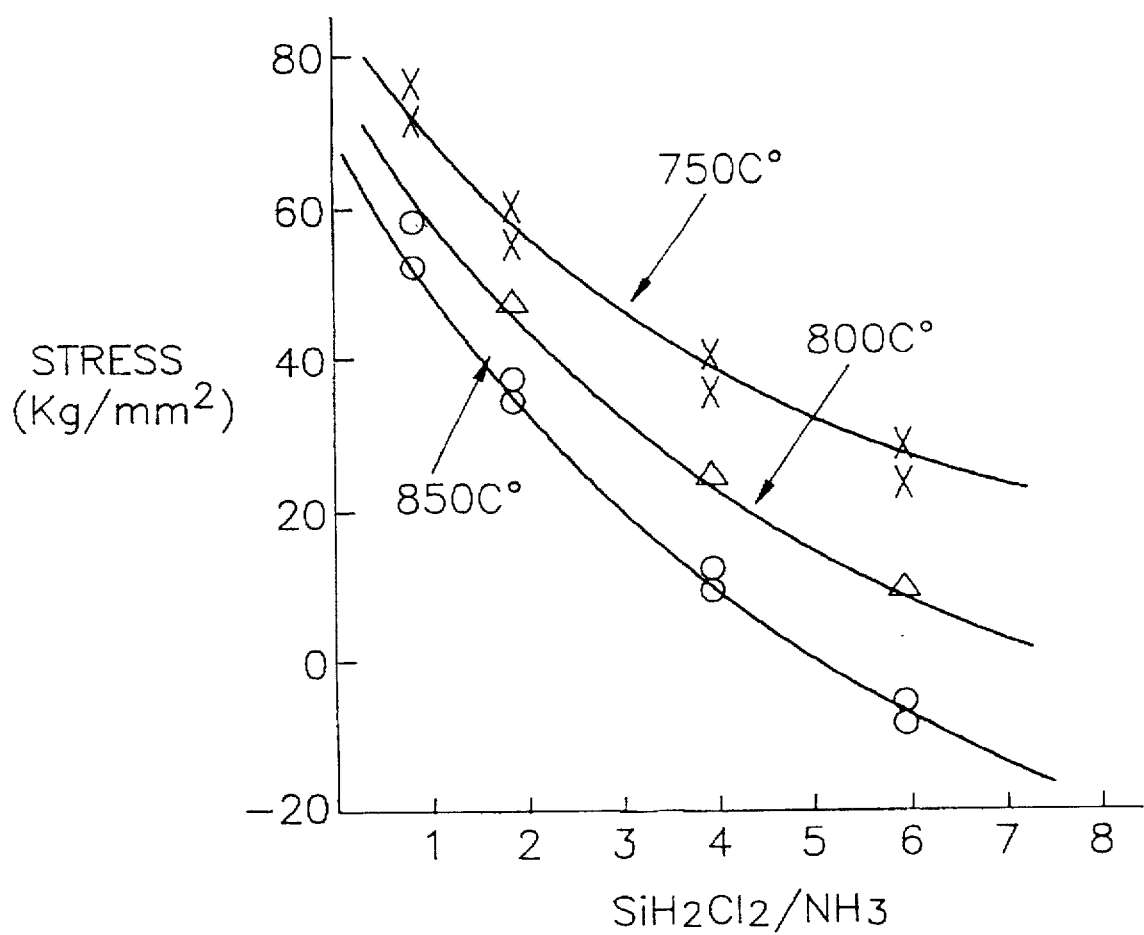
FIG. 3 shows a graph setting forth the relationship between a stress built up in the elastic layer and a ratio of the source gases during the deposition of the elastic layer.

The ratio of the source gases is initially set between 1:1 to 3:1, and then is increased between 6:1 to 8:1 at some point in the deposition thereof. In other word, a lower portion 231 of the elastic layer 230 is formed by reacting source gases, wherein the ratio ranges between 1:1 to 3:1, and an upper portion 232 thereof is formed by reacting source gases, wherein the ratio ranges between 6:1 to 8:1. There are illustrated in FIG. 3 relationship between a stress built up in the elastic layer 230 formed by using the LPCVD method at various different temperature and at 350 mtorr and the ratio of $SiH_2Cl_2$ to $NH_3$. For example, as indicated in FIG. 3, at 850° C., the stress built in the elastic layer 230 is 0 when the ratio of $SiH_2Cl_2$ to $NH_3$ is 5:1. In other word, the elastic layer 230 can be formed in such a way that a tensile stress is built up at the lower portion thereof, and a compressive stress is built at the upper portion thereof, the compressive stress offsetting the tensile stress, thereby controlling the overall stress built up in the elastic layer 230.

Even though the present embodiment is described with respect to the elastic layer 230 having the upper and the lower portions 232, 231, the elastic layer 230 can be made of more than two portions to obtain the same result. In addition, the increasing of the ratio results in the upper portion 232 being Si-rich which will, in turn, allow the elastic layer 230 to be made thicker without the cracks forming.

Figure 2A:
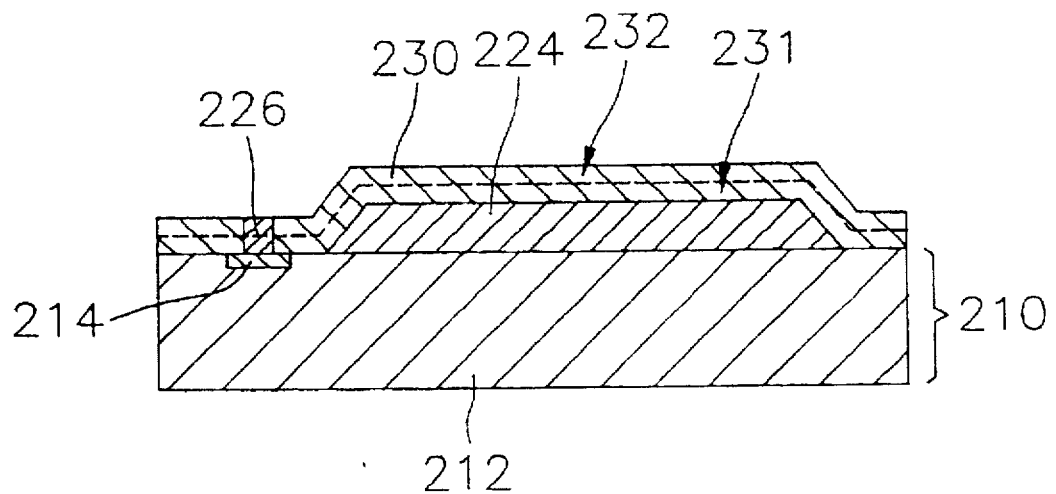
FIGS. 2A to 2F are schematic cross sectional views setting forth a method for the manufacture of an array of M×N thin film actuated mirrors in accordance with the present invention.

Thereafter, there is formed in the elastic layer 230 an array of M×N conduits 226 made of a metal. Each of the conduits 226 is formed by: first creating an array of M×N holes (not shown), each of the holes extending from top of the elastic layer 230 to top of the connecting terminal 214 by using an etching method; and filling therein with the metal by using, e.g., a lift-off method, as shown in FIG. 2A.

Then, a second thin film layer 240, made of an electrically conducting material, and having a thickness of 0.1–2 μm, is formed on top of the elastic layer 230 including the conduits 226 by using a sputtering or a vacuum evaporation method.

Next, a thin film electrodisplacive layer 250, made of a piezoelectric or an electrostrictive material, and having a thickness of 0.1-2 μm, is formed on top of the second thin film layer 240 by using a CVD method, an evaporation method, a Sol-Gel method or a sputtering method. The thin film electrodisplacive layer 250 is then heat treated to allow a phase transition to take place.

Figure 2B:
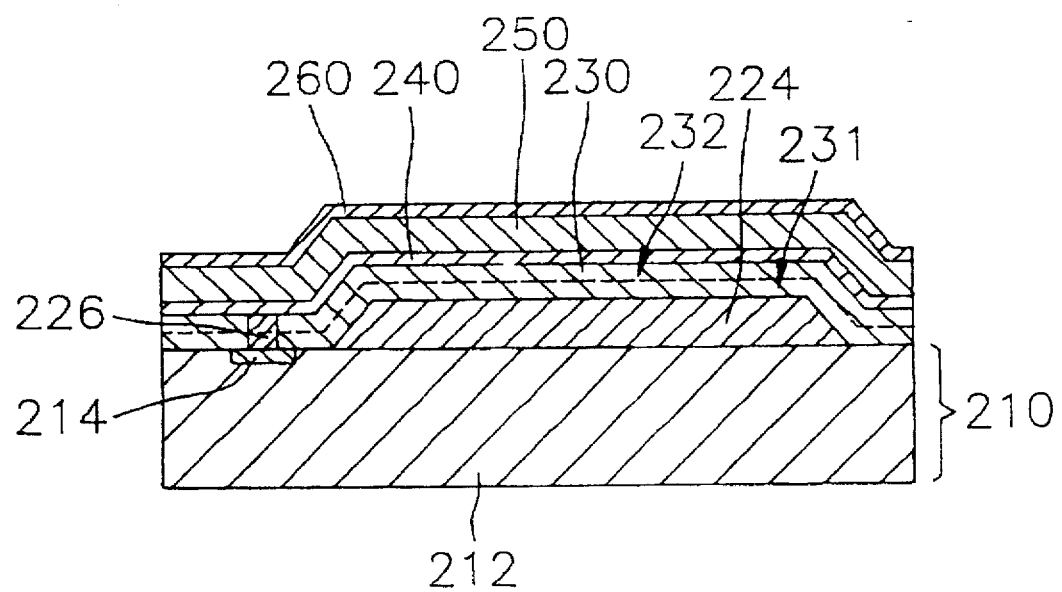

In an ensuing step, a first thin film layer 260, made of an electrically conducting and light reflecting material, and having a thickness of 0.1-2 μm, is formed on top of the thin film electrodisplacive layer 250 by using a sputtering or a vacuum evaporation method, as shown in FIG. 2B.

Figure 2C:
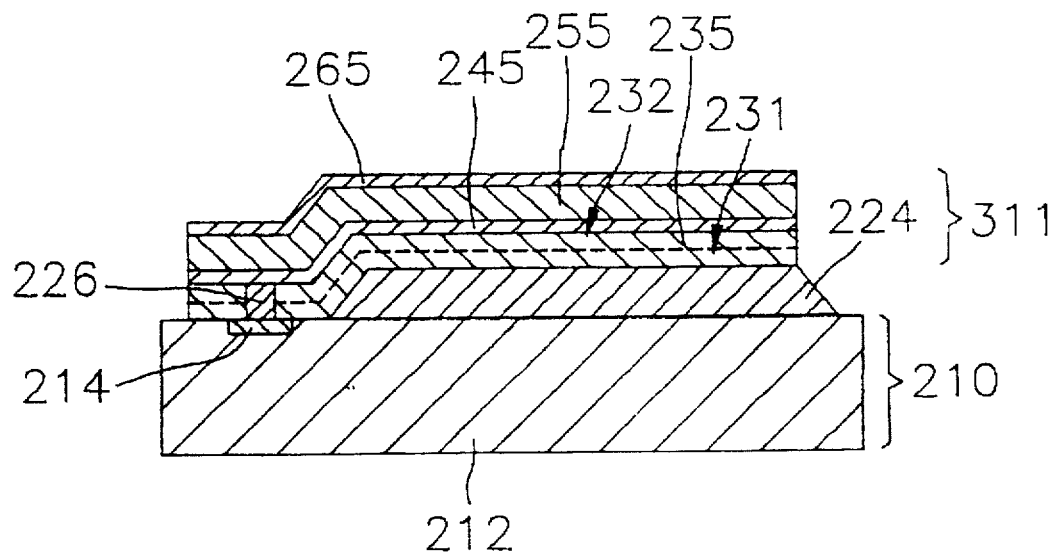

After the above step, the first thin film 260, the thin film electrodisplacive 250, the second thin film 240 and the elastic layers 230 are, respectively, patterned, until the thin film sacrificial layer 224 is exposed, by using a photolithography or a laser trimming method, thereby forming an array 310 of M×N actuating structures 311, each of the actuating structures 311 including a first thin film electrode 265, a thin film electrodisplacive member 255, a second thin film electrode 245, an elastic member 235 and the conduit 226, as shown in FIG. 2C. The second thin film electrode 245 is electrically connected to a corresponding transistor through the conduit 226 and the connecting terminal 214, thereby functioning as a signal electrode in each of the actuating structures 311. The first thin film electrode 265 functions as a mirror as well as a common bias electrode in the array 310 of actuating structures 311.

Since each of the thin film electrodisplacive members 255 is sufficiently thin, there is no need to pole it in case it is made of a piezoelectric material: for it can be poled with the electric signal applied during the operation of the thin film actuated mirrors 301.

Figure 2D:
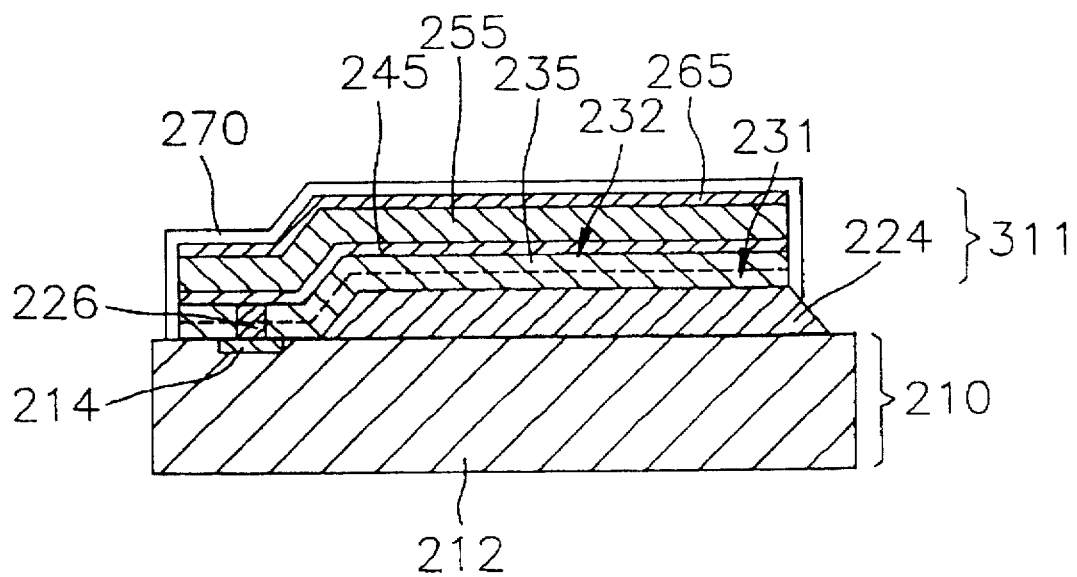

The preceeding step is then followed by completely covering each of the actuating structures 311 with a thin film protection layer 270, as shown in FIG. 2D.

The thin film sacrificial layer 224 is then removed by using an etchant, e.g., hydrogen fluoride (HF) and a BOE, e.g., ammonium fluoride (NH$_4$F).

Figure 2E:
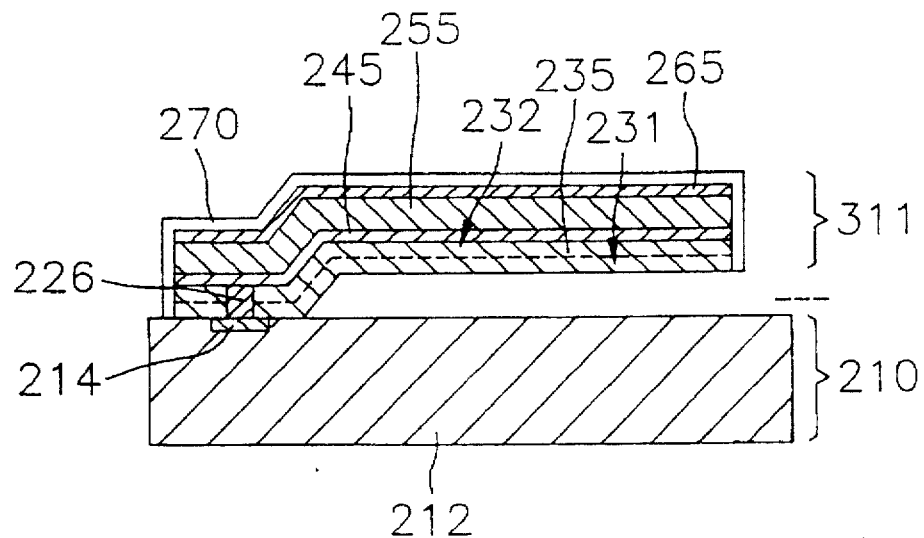

The etchant and the BOE used in the removal of the thin film sacrificial layer 224 are rinsed away by using a rinse, and then the rinse is removed, as shown in FIG. 2E.

Figure 2F:
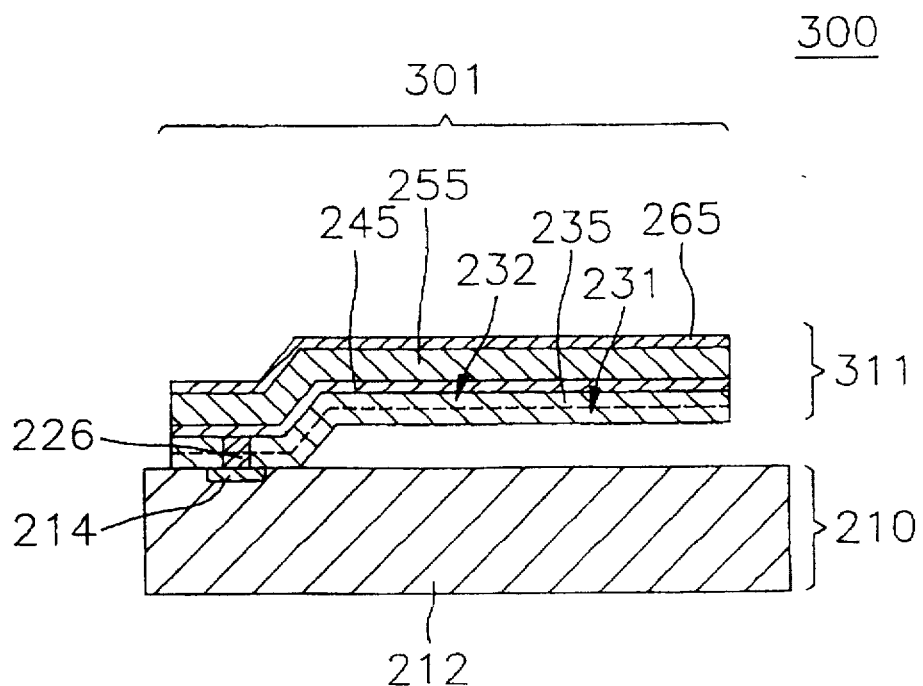

Finally, the thin film protection layer 270 is removed, thereby forming the array 300 of M×N thin film actuated mirrors 301, as shown in FIG. 2F.

In contrast with the method for the manufacture of the array 100 of M×N thin film actuated mirrors 101 previously disclosed, wherein the elastic layer is made of Si$_3$N$_4$, in the inventive method, since the ratio of SiH$_2$Cl$_2$ to NH$_3$ is increased during the deposition of the elastic layer 230, the lower portion 231 of the elastic layer 230 having build up of a tensile stress, and the upper portion 232 of the elastic layer 230, a compressive stress, the compressive stress offsetting the tensile stress therein, thereby controlling the stress built therein.

While the present invention has been described with respect to certain preferred embodiments only, other modifications and variations may be made without departing from the scope of the present invention as set forth in the following claims.

What is claimed is:

1. A method for the manufacture of an array of M×N thin film actuated mirrors forming an array of M×N actuating structures formed on top of an active matrix, wherein M and N are integers, for use in an optical projection system, the method comprising the steps of:

forming a thin film sacrificial layer on top of the active matrix;

depositing an elastic layer on top of the thin film sacrificial layer, wherein the elastic layer comprises at least two layers, each of said at least two layers being made of components with a different stoichiometry;

forming the array of M×N actuating structures on top of the elastic layer, each of the actuating structures including a first thin film electrode, a second thin film electrode, a thin film electrodisplacive member located between said first and second thin film electrodes and adapted to deform when an electric field is applied thereto, and an elastic member arranged to relieve a stress formed in each of the actuating structures when it deforms; and removing the thin film sacrificial layer by etching it with an etchant, thereby forming the array of M×N thin film actuated mirrors.

2. The method of claim 1, wherein the elastic layer is made of a nonstoichiometric silicon nitride.

3. The method of claim 2, wherein the nonstoichiometric silicon nitride is formed by using a CVD method.

4. The method of claim 3, wherein the nonstoichiometric silicon nitride is formed using SiH$_2$Cl$_2$ and NH$_3$ as source gases.

5. The method of claim 4, wherein SiH$_2$Cl$_2$ and NH$_3$ are chemically reacted at 700° to 900° C. and under a pressure of 300 to 1000 mtorr.

6. The method of claim 5, wherein SiH$_2$Cl$_2$ to NH$_3$ ratio is varied during the deposition of the elastic layer.

7. The method of claim 6, wherein the ratio is initially set between 1:1 to 3:1 and then is increased to 6:1 to 8:1 at some point during the deposition of the elastic layer.

8. A method for manufacturing an array of thin film actuated mirrors for use in an optical projection system, the method comprising the steps of:

providing an active matrix comprising a substrate having an array of connecting terminals formed thereon;

forming a thin film sacrificial layer on top of the active matrix;

depositing an elastic layer on said thin film sacrificial layer by a LPCVD process, wherein a ratio of a mixture of source gases is changed during deposition such that a lower elastic layer and an upper elastic layer are formed, said lower and upper elastic layers having different stoichiometries;

forming a lower thin film electrode on top of the elastic layer;

forming an electrodisplacive layer on top of the lower thin film electrode;

forming an upper thin film electrode on top of the electrodisplacive layer, said upper thin film electrode being made of a light reflecting material;

patterning the upper thin film electrode, electrodisplacive layer, lower thin film electrode and the elastic layer, thereby forming an array of actuating structures and exposing said thin film sacrificial layer;

covering the array of actuating structures with protection layer; and etching away said thin film sacrificial layer.

* * * * *